United States Patent [19]

Ameen et al.

[11] 4,334,949
[45] Jun. 15, 1982

[54] REDUCING CARBONATE CONCENTRATION IN AQUEOUS SOLUTION

[75] Inventors: Joseph G. Ameen, Apalachin; Nelson P. Franchak, Binghamton; John Rasile; Dennis L. Rivenburgh, both of Endicott, all of N.Y.

[73] Assignee: International Business Machines Corporation, Armonk, N.Y.

[21] Appl. No.: 210,193

[22] Filed: Nov. 25, 1980

[51] Int. Cl.³ .................. B29C 17/08; B01D 15/04
[52] U.S. Cl. ............................... 156/642; 156/668; 210/683
[58] Field of Search ............... 156/642, 668; 210/664, 210/683; 423/181, 183, 206 R

[56] References Cited

U.S. PATENT DOCUMENTS

| | | | |
|---|---|---|---|
| 3,116,240 | 12/1963 | Downey et al. | 156/642 |
| 3,361,589 | 1/1968 | Lindsey | 156/668 |
| 3,532,568 | 10/1970 | Kovell et al. | 156/642 |
| 3,770,528 | 11/1973 | Hermes | 156/668 |
| 4,125,594 | 11/1978 | Su et al. | 156/642 |

OTHER PUBLICATIONS

Samuelson, O., *Ion Exchangers in Analytical Chemistry*, N.Y., John Wiley & Sons, 1953, pp. 260-261.

*Primary Examiner*—Ivars C. Cintins
*Attorney, Agent, or Firm*—Pollock, Vande Sande & Priddy

[57] ABSTRACT

A method for reducing the concentration of carbonate in an aqueous solution which includes contacting the aqueous solution with a strongly basic ion-exchange resin.

6 Claims, 1 Drawing Figure

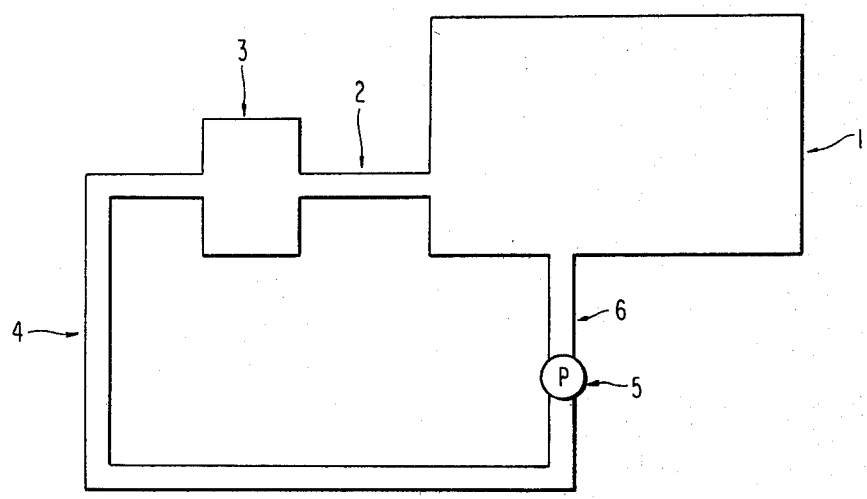

REDUCING CARBONATE CONCENTRATION IN AQUEOUS SOLUTION

DESCRIPTION

1. Technical Field

The present invention is concerned with reducing the concentration of carbonate ions in an aqueous solution. The process of the present invention is especially applicable in treating alkali metal hydroxide compositions in order to reduce the carbonate ion content and to concomitantly maintain the concentration of hydroxide ions at a substantially constant level. The process of the present invention is preferably concerned with treating aqueous solutions used for etching which solutions contain an alkali metal hydroxide, such as potassium hydroxide.

2. Background Art

Aqueous alkali metal hydroxide solutions, and especially aqueous potassium hydroxide solutions, have been employed as etchants, such as etchants for polyimides to remove the polyimide selectively from a substrate. For instance, integrated circuit carriers are now extensively used on a commercial scale which includes a ceramic substrate upon which is a first layer of chrome, followed by a layer of copper, followed by another layer of chrome, followed by a dielectric layer of polyimide, upon which is a second sequence of metal layers of chrome/copper/chrome. Electrical interconnection between the two series of metal layers is achieved through vias or holes etched in the polyimide dielectric.

The integrity of the interconnection between the two series of metal layers is very critical in the suitability of the integrated circuit carrier. In particular, the vias or holes in the polyimide should be free from any residue and should be extremely clean.

Presently, the use of aqueous solutions of potassium hydroxide for etching, for instance, polyimides is not entirely satisfactory. For instance, because the water inherently absorbs carbon dioxide from the atmosphere, carbonate ions ($CO_3^{--}$) are formed in the solution, thereby decreasing the concentration of hydroxide ions present. Accordingly, etching with potassium hydroxide could stand improvement with respect to stability and reproducibility of the process. For instance, an initial charge of potassium hydroxide of about 14.67 grams per liter is reduced to about 11.36 grams per liter after 24 hours, and then to about 6 to about 8 grams per liter after about 48 hours. Accordingly, it is necessary to change the etch solution about every two days in order to provide adequate etching.

SUMMARY OF INVENTION

The present invention is concerned with a process for reducing the concentration of carbonate ions in an aqueous solution. In addition to the carbonate ions, the aqueous solution also contains about 0.1 to about 3% by weight of an alkali metal hydroxide. The process includes contacting the aqueous solution with a strongly basic ion-exchange resin in the hydroxide form.

Moreover, the present invention is concerned with a process for etching which includes contacting the material to be etched with an aqueous etchant which contains about 0.1 to about 3% by weight of an alkali metal hydroxide. A portion of the hydroxide is consumed in the etching, and a portion of the hydroxide is consumed in reacting with carbon dioxide which is inherently dissolved in an aqueous etchant to thereby form carbonate ions. The aqueous solution containing the carbonate and reduced amount of hydroxide ions is then contacted with the strongly basic ion-exchange resin which is in the hydroxide form. This results in exchange of the carbonate ions with hydroxide ions in such a way that the original hydroxide concentration is maintained at a substantially constant level. The treated solution is then reused for further etching.

BRIEF DESCRIPTION OF DRAWING

The FIGURE is a schematic diagram of equipment used to carry out the invention.

DESCRIPTION OF BEST AND VARIOUS MODES

The etchant composition treated according to the present invention contains water and an alkali metal hydroxide, wherein the alkali metal hydroxide is present in amounts of about 0.1 to about 3% by weight, and preferably about 0.6 to about 1.6% by weight. The preferred alkali metal hydroxide employed is potassium hydroxide.

In addition, the aqueous compositions treated according to the present invention will inherently contain some quantity of carbonate ions derived from carbon dioxide which is absorbed into the aqueous solution from the surrounding atmosphere.

The aqueous solution is next contacted with a strongly basic ion-exchange resin which is in the hydroxide form. Strongly basic anion-exchange resins and methods of making them are well known. Also, a number of strongly basic anion-exchange resins are commercially available. The preferred strongly basic anion-exchange resins are the strongly basic quaternary ammonium anion-exchange resins. Such resins can, for example, be prepared by reacting a tertiary amine with an insoluble cross-linked copolymer of a predominant amount of a monovinyl aromatic hydrocarbon and a minor proportion of a divinyl aromatic hydrocarbon, such as a copolymer of styrene and divinylbenzene, or a copolymer of styrene, ethylvinylbenzene and divinylbenzene, which copolymer contains on its aromatic nuclei substituent halomethyl groups, e.g. chloromethyl or bromomethyl groups, whereby an insoluble resinous quaternary ammonium base or a salt thereof is obtained.

Other strongly basic quaternary ammonium anion-exchange resins are reaction products of a tertiary amine and a haloalkylated insoluble copolymer of one or more vinyl aromatic compounds, such as styrene or vinylanisole and a minor proportion of a polyolefinic compound, e.g. divinylbenzene, isoprene, butadiene, trivinylbenzene, etc., with one another to form a product containing on the aromatic nuclei substituent groups having the general formula:

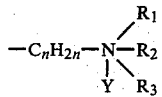

in which n is an integer having a value of from 1 to 4, $R_1$, $R_2$ and $R_3$ represent monovalent organic radicals, and Y is an anion. The strongly basic quaternary ammonium anion-exchange resins are prepared by haloalkylating, preferably chloromethylating, an insoluble vinyl aromatic resin and then reacting the haloalkylated product with a tertiary amine such as trimethylamine, triethylamine, dimethylbenzylamine, dimethylethanolamine, or dimethylaniline. Other tertiary amines, such as tributylamine, N-methylmorpholine and pyridine, are also operable, but the products are somewhat less stable than those made with the tertiary amines first mentioned. If the ion-exchange resin obtained is not in the hydroxide upon receipt, such can be readily converted thereto.

It should further be understood that the ionic characteristics of the polymeric materials is primarily determined by the polar groups, and is quite independent (except for physical properties) of the nonpolar portion of the resin structure.

Specific ion-exchange resins in the hydroxide form employed in the present invention include Amberlite IRA-900 and Amberlite IRA-400 available from Rohm and Haas which are styrene-divinylbenzene copolymers having quaternary ammonium functionality. Discussion of various properties of Amberlite ion-exchange resins can be found in the following publications: Amberlite IRA-400 technical notes IE-122-67/76, September 1978; Amberlite IRA-900 technical notes IE-129-76, September 1979; Amberlite Ion Exchange Resins Laboratory Guide IE-85-64/77, September 1979; and Amberlite Ion Exchange Resins, Fluid Process Chemicals and Apparatus Summary Chart of Typical Properties and Application, from Rohm and Hass, Philadelphia, Pa., disclosures of which are incorporated herein by reference.

The flow rate of the composition through a typical column is about 2.5 to about 6 liters per minute per cubic foot of resin bed. The solution during the contact with the ion-exchange resin is usually at about room temperature to about 50° C., and preferably is about 30° to about 40° C. The ion-exchange resins are generally operated for at least about 30 days before regeneration which is achieved by employing a 4% sodium hydroxide solution at a flow rate of about 1 liter per minute per cubic foot of resin bed. A typical bed employed contains about 1 ft.$^3$ of resin.

The contact with the anion-exchange resin results in eliminating the alkali metal hydroxide concentration as a variable and allows for more consistent etching and a significant reduction in the maintainence of the bath. For instance, in view of the reduction in the concentration of the alkali metal hydroxide, such as potassium hydroxide, due to the presence of carbonate ions, as discussed hereinabove, it is usually necessary to change the etch solution about every two days. On the other hand, the etch solution when treated according to the present invention is usable for at least about 3 months.

The contact of the aqueous solution with the anion-exchange resin results in exchange of one $CO_3^{--}$ anion for two $OH^-$ anions. As the hydroxide ions emerge from the ion-exchange column, all of the carbonate ion is removed, thereby restoring the hydroxide ion concentration to its original content. Even though two hydroxide anions are released, the potassium hydroxide concentration does not exceed the original starting concentration, since $CO_2$ which forms the $CO_3$ anions in solution, reacts as follows with OH:

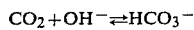

$CO_2 + OH^- \rightleftharpoons HCO_3^-$

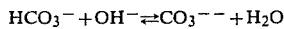

$HCO_3^- + OH^- \rightleftharpoons CO_3^{--} + H_2O$

Thus, the absorption of $CO_2$ consumes two $OH^-$ anions, while the anion-exchange resin puts them back into the aqueous solution. The $OH^-$ consumed in etching the polyimide also is replaced by a similar reaction on a one-to-one basis. However, the amount consumed is very small and insignificant compared to the amount reacted with $CO_3^{--}$. In addition, the anion-exchange resin results in filtration of the polyimide which may be present in undissolved form in the solution from the etching process.

That the present invention results in replacing hydroxide ions back into the hydroxide-containing aqueous solution is surprising, since 4% hydroxide solutions are employed to recharge the anion-exchange resins employed according to the present invention. Accordingly, this means that 4% OH solution will remove all of the $CO_3^{--}$ from the column and put such back into the effluent coming out of the column. The present invention results in just the opposite type of reaction. When the aqueous solutions which contain about 0.1 to about 3% by weight of the alkali metal hydroxide is passed through the anion-exchange resins, $CO_3^{--}$ is attached to the column and only $OH^-$ ions appear in the effluent.

In addition, since the anion-exchange resins employed according to the present invention contain quaternary ammonium groups, some are leached out of the base and get into the aqueous composition, thereby interfering with the hydroxide concentration in the solution because of their acid and base accepting nature, thus acting as a buffer in the solution. Accordingly, such can be removed from the solution by contacting the solution after contact with the anion-exchange resin with an activated charcoal or carbon media. The charcoal absorbs the organic amines which may be present in the aqueous solution.

Activated carbon or charcoal is an amorphous form of carbon characterized by high absorbtivity for gases, vapors and colloidal solids. The carbon is obtained by the destructive distillation of wood, nut shells, animal bones, or other carbonaceous material. It is "activated", for example, by heating to 800° to 900° C. with steam or carbon dioxide, which results in a porous internal structure (honeycomb-like). The internal surface area of activated carbon averages about 10,000 square feet per gram. The density is from about 0.08 to about 0.5. A typical charcoal bed for the flow rates discussed herein is about ½ to about 1 cubic foot.

Reference to the FIGURE is a schematic diagram of the equipment used to carry out the present invention. In particular, numeral 1 refers to the etching tank which holds the alkali metal hydroxide etching solution. The solution is removed from the etching tank 1 via conduit 2 and introduced into anion-exchange bed 3. The treated solution is removed from the anion-exchange bed 3 via conduit 4 and is returned to the etch tank 1 via pump 5 and conduit 6. In addition, as discussed hereinabove, the arrangement can also include an activated carbon media located after the anion-exchange resin bed 3 and before the solution is returned to the etch tank 1 via conduit 6.

The following nonlimiting examples are presented to further illustrate the present invention.

EXAMPLE 1

About 10 liters of an aqueous potassium hydroxide solution containing about 13.33 grams/liter (g/l) of KOH are added to an etching tank. The solution is circulated at a rate of about 105.68 gallons/hour through 1.04 ft.³ bed of Amberlite IRA-400 ion-exchange resin for about 1 hour. The KOH content is determined to be about 13.33 g/l.

Next, the system, in addition to contact with the ion-exchange resin, is operated by spraying the solution into the tank as is done during etching. After 1 hour of operating in this manner, the KOH content is determined to be about 13.72 g/l. The spraying operation adds about 1.1 g/l/hr. of $CO_2$ into the solution. The KOH determinations are done by titrations and are accurate within about ±0.5 g/l.

EXAMPLE 2

The general procedure of Example 1 is repeated, except that the aqueous potassium hydroxide solution initially contains about 13.22 grams per liter of potassium hydroxide and about 13.33 grams per liter of potassium hydroxide after 1 hour of spraying and contact with the ion-exchange resin.

EXAMPLE 3

The general procedure of Example 1 is repeated, except that the aqueous solution initially contains about 11.56 grams per liter of potassium hydroxide and about 13.27 grams per liter of potassium hydroxide after about 7 hours of operation with contact with the anion-exchange resin.

EXAMPLE 4

The general procedure of Example 1 is repeated, except that the aqueous solution contains about 11.87 grams per liter of potassium hydroxide and about 13.01 grams per liter of potassium hydroxide after about 7½ hours of operation with contact with the anion-exchange resin.

EXAMPLE 5

The general procedure of Example 1 is repeated, except that the initial content of potassium hydroxide after spraying for about ½ hour is about 13.94 grams per liter; after operation with the ion-exchange resin and spraying for about 1 hour is about 13.38 grams per liter; after spraying for 2 hours without the anion-exchange resin is about 13.38 grams per liter of potassium hydroxide; and after an additional hour of operation with contact with the anion-exchange resin is about 13.83 grams per liter.

EXAMPLE 6

The general procedure of Example 1 is repeated, except that the aqueous potassium hydroxide solution initially contains about 11.87 grams per liter of potassium hydroxide; about 12.4 grams per liter of potassium hydroxide after about 3 hours operation with the ion-exchange resin; and about 12.54 grams per liter of potassium hydroxide after about 7 hours operation with the ion-exchange resin.

EXAMPLE 7

The general procedure of Example 1 is repeated, except that the aqueous potassium hydroxide solution initially contains about 13.22 grams per liter of potassium hydroxide; about 14.11 grams per liter of potassium hydroxide after about 3 hours treatment with the anion-exchange resin; and about 14.34 grams per liter of potassium hydroxide after operation of 7 hours with the anion-exchange resin.

EXAMPLE 8

The general procedure of Example 1 is repeated, except that the aqueous potassium hydroxide solution initially contains about 11.76 grams per liter of potassium hydroxide and about 12.6 grams per liter of potassium hydroxide after operation for about 4 hours employing the anion-exchange resin.

EXAMPLE 9

The general procedure of Example 1 is repeated, except that the aqueous solution contains about 8.79 grams per liter of potassium hydroxide initially and about 9.18 grams of potassium hydroxide after about 4 hours operation employing the anion-exchange resin.

As noted from the above examples, the general trend is that the use of the anion-exchange resin provides for increased or substantially constant amount of potassium hydroxide in the aqueous solution as opposed to the significant reduction in potassium hydroxide discussed hereinabove concerning operation without the anion-exchange resin.

What is claimed is:

1. A process for etching a polyimide which comprises contacting said polyimide with an aqueous etchant containing about 0.6 to about 1.6% by weight of an alkali metal hydroxide whereby a portion of the hydroxide is consumed in etching and is consumed in reacting with $CO_2$ absorbed from the atomsphere and dissolved in the aqueous etchant to form carbonate, and then contacting the used carbonate containing etchant with a strongly basic ion-exchange resin bed in the hydroxide form wherein carbonate ions in the etchant are exchanged with hydroxide ions, thereby maintaining the hydroxide concentration is said etchant substantially constant and filtering polyimide which may be present in undissolved form in the solution, and wherein the flow rate of said etchant through said ion-exchange resin is about 2.5 to about 6 liters per minute per cubic foot of resin bed, and then reusing the treated solution for etching.

2. The process of claim 1 wherein said alkali metal hydroxide is KOH.

3. The process of claim 1 or 2 wherein said anion-exchange resin contains quaternary ammonium groups.

4. The process of claim 3 wherein said resin is based on a styrene-divinyl benzene copolymer.

5. The process of claim 1 or 2 wherein the solution is at a temperature of about room temperature to about 50° C. when contacting said resin.

6. The process of claim 1 or 2 wherein the solution is at a temperature of about 30° to about 40° C. when contacting said resin.

* * * * *